(12) United States Patent
Schmidt et al.

(10) Patent No.: US 6,254,343 B1
(45) Date of Patent: Jul. 3, 2001

(54) LOW-NOISE COOLING FAN FOR ELECTRONIC COMPONENTS AND METHOD OF MAKING THE SAME

(75) Inventors: Detlef W. Schmidt, Schaumburg, IL (US); Garron K. Morris, Niskayuna, NY (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/455,188

(22) Filed: Dec. 6, 1999

(51) Int. Cl.⁷ ...................................................... F01D 1/00
(52) U.S. Cl. ............................................................. 415/222
(58) Field of Search .................................. 415/119, 207, 415/219.1, 220, 222, 227, 196

(56) References Cited

U.S. PATENT DOCUMENTS

| | | | |
|---|---|---|---|
| 3,334,807 | * | 8/1967 | McMahan ........................ 415/222 X |
| 4,564,335 | * | 1/1986 | Harmsen et al. ................. 415/222 X |
| 4,568,243 | * | 2/1986 | Schubert et al. ................. 415/119 X |
| 4,734,015 | * | 3/1988 | Wrobel ............................. 415/222 X |
| 4,819,503 | * | 4/1989 | Fazi, Jr. et al. .................. 415/119 X |
| 5,197,854 | * | 3/1993 | Jordan ................................. 415/119 |

FOREIGN PATENT DOCUMENTS

3612249  *  10/1987  (DE) ..................................... 415/220

* cited by examiner

Primary Examiner—John E. Ryznic
(74) Attorney, Agent, or Firm—Heather L. Mansfield; Kenneth A. Haas

(57) ABSTRACT

An improved cooling fan (12) fan for cooling an electronic component includes a rotor (26) rotatably mounted in a housing (18) and having a plurality of fan blades (28). The housing (18) includes a first end (20), a second end (24), and a passage (24) interconnecting the first end and the second end to define an air flow path (25) therebetween. An entry port (16) is defined by an upstream portion of the housing (18) generally adjacent the housing first end (20), with the entry port (16) having a cross-sectional area greater than a cross-sectional area of the passage (24). The entry port (16) and the passage (24) being separated by a transition zone (30), with the entry port (16) and the transition zone (30) cooperating to define an abrupt step (36). The abrupt step (36) is adapted to at least partially affect the flow of air flowing along the flow path (25), thereby reducing the ambient noise level of the fan.

35 Claims, 3 Drawing Sheets

LOW-NOISE COOLING FAN FOR ELECTRONIC COMPONENTS AND METHOD OF MAKING THE SAME

FILED OF THE INVENTION

The present invention relates generally to cooling fans for electronic components. More specifically, the present invention relates to an improved housing for such fans which lowers ambient noise levels, and further relates to a method of reducing the noise levels in existing fans.

BACKGROUND OF THE INVENTION

Power devices in electronic components produce heat, and the heat must be removed in order for the electronic component to function properly. In some cases, simple convection provides adequate cooling. However, in a wide variety of applications, simple convection may not be sufficient and thus cooling fans must be used. The cooling fans greatly improve airflow past the devices, thereby preventing overheating and premature failure. Unfortunately, the cooling fans add a significant amount of noise to the overall system. In many cases, this added noise is undesirable and/or unacceptable.

Designers of electronic components are constantly searching for ways to reduce fan noise, such as by altering a number of design parameters including the design, pitch and size of the fan blades and the clearance of the fan blade tips within the housing. Nevertheless, there is a continuing need for ever quieter cooling fans for electronic components.

DETAILED DESCRIPTION OF THE PREFERRED EMBODIMENT

The following descriptions of the preferred embodiments are not intended to limit the scope of the invention to the precise forms disclosed, but instead are intended to be illustrative of the principles of the invention so that others may follow its teachings.

Figure 1:
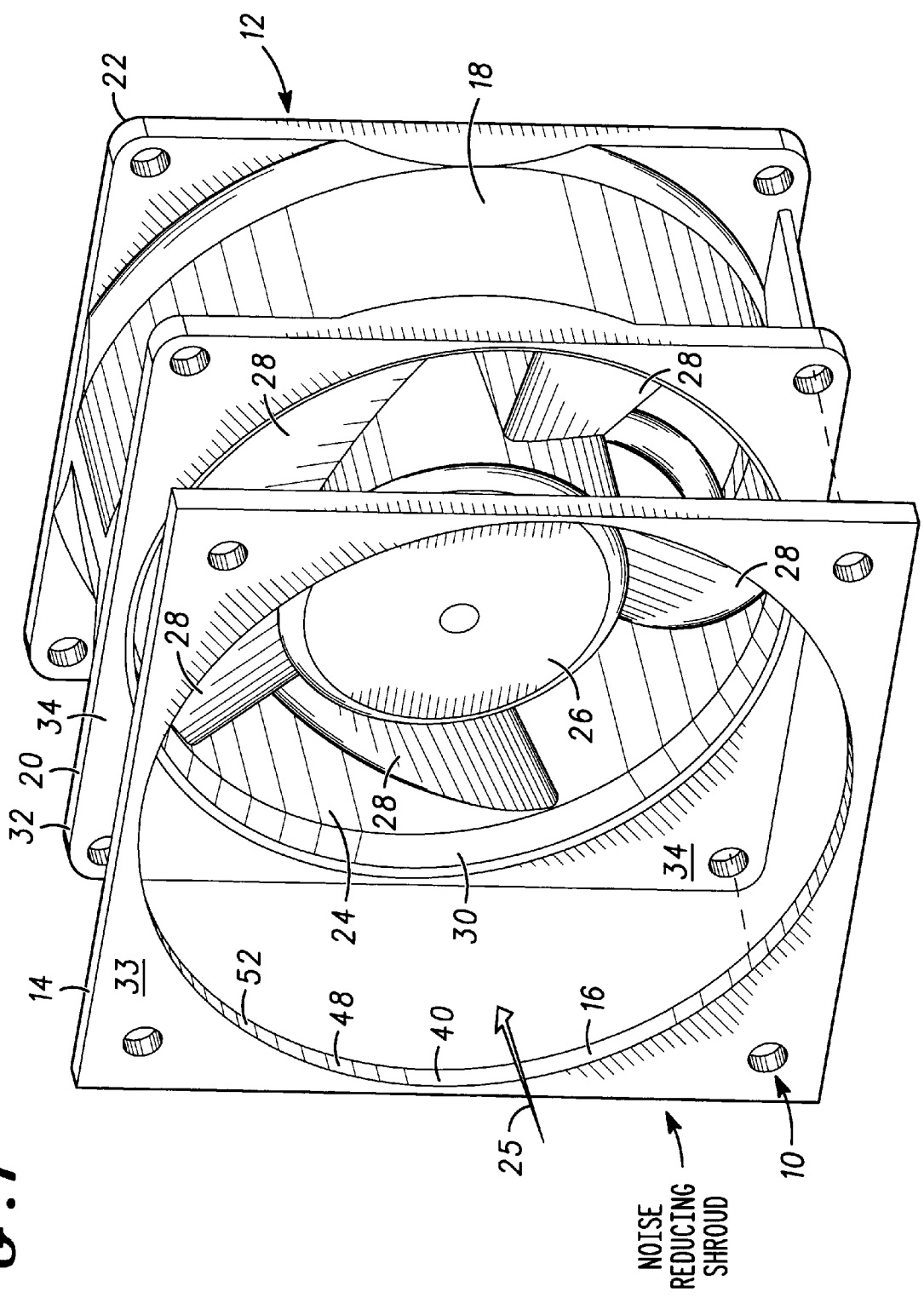
FIG. 1 is a partially exploded view isometric view of a muffin type cooling fan and an entry port therefor constructed in accordance with the teachings of the present invention.

Referring now to the drawings, FIG. 1 illustrates an entry shroud 10 constructed In accordance with the teachings of the present invention and which is shown with a muffin-type fan 12 of the type commonly employed for the cooling of electronic components (not shown). The shroud 10 may be constructed of a plate 14 having a port 16 defined therein, which plate 14 may be attached to a housing 18 of the fan 12 using suitable fasteners (not shown). Alternatively, the shroud 10 and its associated port 16 may be formed as part of the housing 18 of the fan 12 using known molding or other fabrication techniques.

The fan 12 includes the housing 18 having an inlet end 20, an outlet end 22, and a generally cylindrical passage 24 extending between the inlet end 20 and the outlet end 22, such that air will flow through the housing 18 along a flow path indicated by the reference arrow 25. As shown in FIG. 1, the fan 12 typically includes a fan rotor 26 having a plurality fan blades 28 extending radially therefrom, with the fan rotor 26 being rotatably supported in the housing 18 in a known manner and driven by an electrical motor (not shown) in a known manner.

Figure 3:
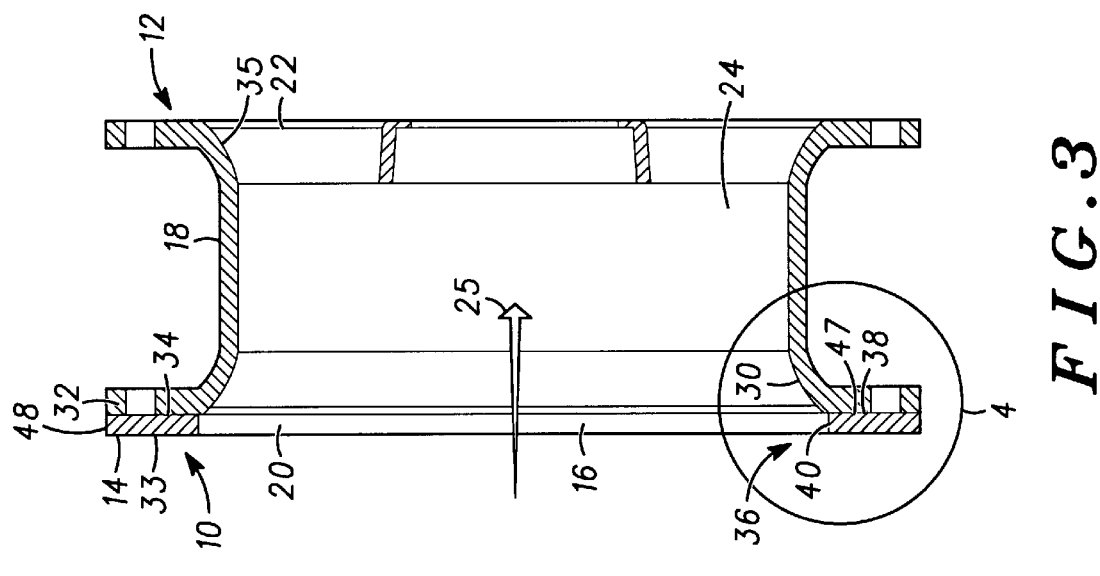
FIG. 3 is a cross-sectional view taken along line 3—3 of FIG. 2.
Figure 4:
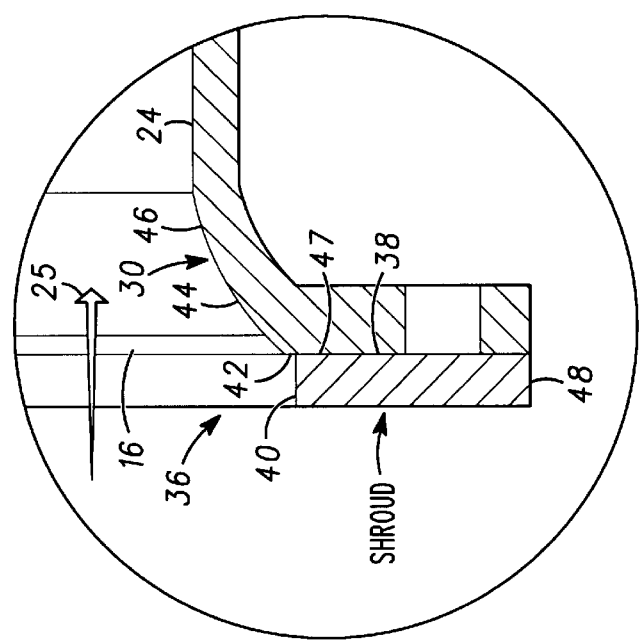
FIG. 4 is an enlarged fragmentary cross-sectional view taken about the circumscribed portion of FIG. 3.

The inlet end 20 of the housing 18 may include an outwardly flared transition 30, which will have an entry diameter slightly greater than the three inch (3") nominal diameter of the passage 24. As shown in FIGS. 3 and 4, the flared transition is disposed between the entry port 16 and the passage 24.

In the embodiment shown, the passage 24 has a length of about one and one-half inches (1.5"). The flared transition 30 terminates in a front mounting plate 32 having a generally fiat surface 34. It will be understood that, if the shroud 10 is molded in conjunction with the housing 18 as alluded to above, then an upstream face 33 of the plate 14 will form the front mounting plate 32. Similarly, the housing 18 may include a flared transition 35 adjacent the outlet end 22 as shown in FIG. 3. It will be understood that the above-given dimensions for the fan 12 will vary depending on the size of the fan chosen for a particular application.

As shown in FIGS. 3 and 4, a step 36 is defined generally adjacent an interface 38 between the entry port 16 and the passage 24. As best shown in the enlarged view of FIG. 4, the entry port 16 includes an inner surface 40, which preferably has a generally flat cross section oriented generally parallel to the flow 25, while an upstream portion of the flared transition 30 includes a surface 42, which also preferably has a generally flat cross section oriented generally perpendicular to the flow 25. It will be noted that the flared transition includes a surface 44, which preferably has a generally curved cross section, which leads to a sloping portion 46, preferably having a generally flat cross section and being disposed downstream towards the passage 24. As shown, the inner surface 40 and the surface 42 intersect at a vertex 47 which is roughly 90 degrees. The vertex 47 may of course have a slight radius or other characteristics dictated by assembly or molding practices. Further, the cross section defined adjacent the intersection of the entry port 16 and the flared transition 30 may take a variety of shapes, as long as the flow interrupting step 36 is defined thereby.

Further, it will be understood that the cross-sectional shape defined by the intersection of the surfaces 40, 42, 44 and 46 together define a means 49 which protrudes at least partially into the flow path 25, and which further forms cavities which recede away from the flow path 25, all of which alters or at least partially interrupts the flow characteristics of air flowing along the flow path 25. It will be understood that the means 49 may be defined by other combinations of intersecting surfaces, which may protrude into, away from, or partially into and partially away from the flow path 25.

As shown in FIG. 1, the entry port 16 is sized to define or encompass a cross sectional area that is greater than the cross sectional area defined by the passage 24. According to a preferred embodiment, the cross sectional area defined by the entry port will be between about 5% to about 10% greater than the cross sectional area of the passage 24. Still preferably, for a fan 12 having a nominal diameter of three inches (3"), the entry port 16 will have a nominal diameter of about three and one-eighth inches (3⅛").

The entry port 16 includes a length dimension 48, which generally corresponds to a thickness of the plate 14 if the entry shroud 10 is formed of a separate piece. For a fan 12 having a passage 24 with a nominal length dimension 50 of one and ½ inches (1.5 inches), the plate 14 will have a thickness between about 0.06 inches and about 0.20 inches, which corresponds to a length dimension 48 for the entry port 16 between about 4% and about 13% of the length 50 of the passage 24.

Figure 2:
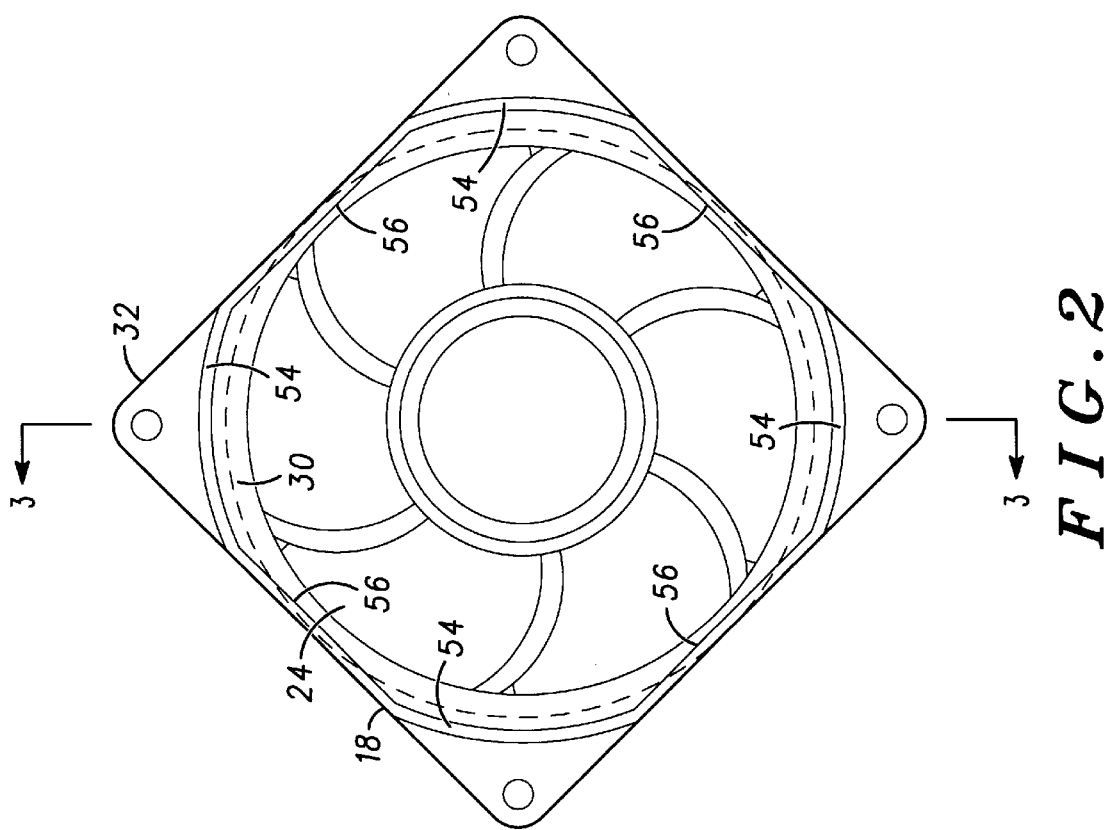
FIG. 2 is an elevational view of a housing for the muffin-type cooling fan shown in FIG. 1, with the housing having an entry port constructed in accordance with the teachings of the present invention.
Figure 5:
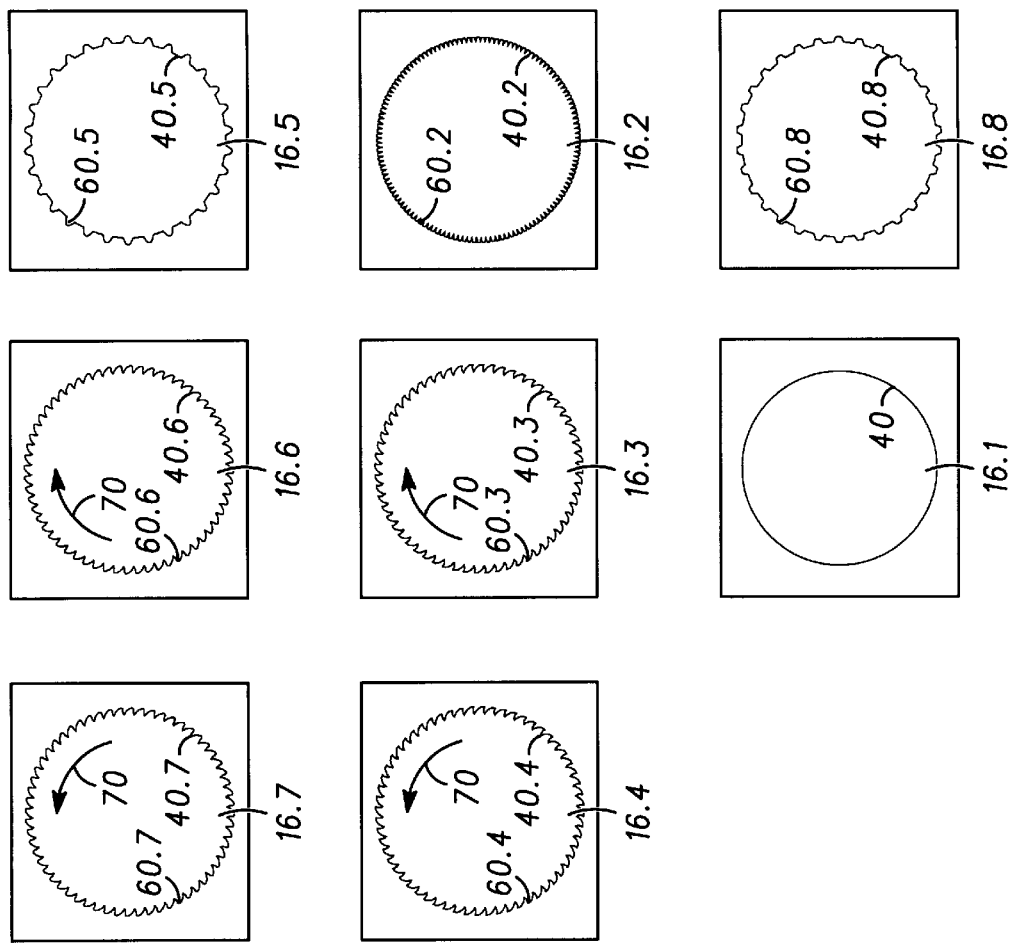
FIG. 5 illustrates 13 different entry port profiles.

Referring again to FIG. 1, the entry port 16 includes a generally curved inner edge 52, thus giving the entry port a generally round entry profile (see also, for example, the entry profiles illustrated in FIG. 5). Alternatively, depending on the dimensions of the fan 12, the inner edge 52 of the entry port 16 may include a number of curved sections 54 and a number of generally straight sections 56, giving the entry port 16 the entry profile shown in FIG. 2.

Referring now to FIG. 5, a variety of possible entry ports are shown, with each having a different entry profile. The entry ports are labeled as entry ports 16.1 through 16.8. The entry port 16.1 is substantially as described above and includes a flat surface 40, and thus will not be described further.

The entry port 16.2 includes an inner surface 40.2 having a plurality of sharp fins 60.2 spaced about the inner circumference thereof, with each of the sharp fins 60.2 extending about 0.2 inches radially inwardly into the flow path 25.

The entry port 16.3 includes an inner surface 40.3 having a plurality of sharp fins 60.3 spaced about the inner circumference thereof, with each of the sharp fins 60.3 extending about 0.2 inches radially inwardly into the flow path 25. Each of the fins 60.3 is angled in a direction counter to the rotational direction 70 of the fan rotor 26.

The entry port 16.4 includes an inner surface 40.4 having a plurality of sharp fins 60.4 spaced about the inner circumference thereof, with each of the sharp fins 60.4 extending about 0.2 inches radially inwardly into the flow path 25. Each of the fins 60.4 is angled in a direction coinciding with the rotational direction 70 of the fan rotor 26.

The entry port 16.5 includes an inner surface 40.5 having a plurality of lobes 60.5 spaced about the inner circumference thereof, with each of the lobes 60.5 extending about 0.2 inches radially inwardly into the flow path 25.

The entry port 16.6 includes an inner surface 40.6 having a plurality of rounded fins 60.6 spaced about the inner circumference thereof, with each of the rounded fins 60.6 extending about 0.2 inches radially inwardly into the flow path 25. Each of the fins 60.6 is angled in a direction counter to the rotational direction 70 of the fan rotor 26.

The entry port 16.7 includes an inner surface 40.7 having a plurality of rounded fins 60.7 spaced about the inner circumference thereof, with each of the rounded fins 60.7 extending about 0.2 inches radially inwardly into the flow path 25. Each of the fins 60.7 is angled in a direction coinciding with the rotational direction 70 of the fan rotor 26.

The entry port 16.8 includes an inner surface 40.8 having a plurality of rounded indentations 60.8 spaced about the inner circumference thereof, with each of the rounded indentations 60.8 extending about 0.2 inches radially outwardly into the inner surface 40.8 (i.e., away form the flow path 25).

In operation, the shroud 10 may be constructed in a number of possible ways. If the shroud 10 is constructed of a separate plate 14, then the plate 14 having the entry port 16 defined therein is mechanically fastened, glued, bonded, or otherwise secured to the housing 18 of the fan 12 along the interface 38. Second, if the shroud 10 is formed integrally with the housing 18, then the entire unit may be molded using conventional molding practices following the above outlined shape and/or dimensional characteristics for the entry port 16. Third, the plate 14 may be formed in a mounting portion of the electronic component to be cooled (not shown), such that the step 36 is formed when the fan 12 is mounted to the electronic component.

Air is drawn through the housing 18 of the fan 12 in response to rotation of the rotor 26 and its attached fan blades 28 in a conventional manner. As air flows along the flow path 25, the flow characteristics of the air is at least partially altered and/or interrupted as the air flows past the step 36. The air flow may be further altered and or interrupted depending on the shape of the inner surface 40 of the entry port 16 (i.e., by substituting any one of the profiles 16.1 through 16.8 shown in FIG. 5 as outlined above).

Those skilled in the art will appreciate that, although the teachings of the invention have been illustrated in connection with certain embodiments, there is no intent to limit the invention to such embodiments. On the contrary, the intention of this application is to cover all modifications and embodiments fairly falling within the scope of the appended claims either literally or under the doctrine of equivalents.

What is claimed:

1. A fan for cooling an electronic component, the fan comprising:

a rotor having a plurality of fan blades and being rotatably mounted within a housing, the housing including a first end, a second end, and a passage interconnecting the first end and the second end to define an air flow path therebetween; and an entry port defined by a portion of the housing generally adjacent the housing first end, the entry port having a cross-sectional area greater than a cross-sectional area of the passage, the entry port and the passage being separated by a transition zone, the entry port and the transition zone cooperating to define an abrupt step, the abrupt step being adapted to at least partially affect the flow of air flowing along the flow path, thereby reducing the ambient noise level of the fan, wherein the cross-sectional area of the entry port is sized to be between about 5% to about 10% greater than the cross-sectional area of the passage.

2. The fan of claim 1, wherein a length of the entry port is sized to be substantially less than a length of the passage.

3. The fan of claim 1, wherein a length of the entry port is between about 4% and about 13% of a length of the passage.

4. The fan of claim 1, wherein a length of the entry port is between about 0.06 inches and about 0.20 inches.

5. The fan of claim 4, wherein the housing has a length of about 1.5 inches, and wherein the entry port has a length of between about 0.06 inches and about 0.20 inches.

6. The fan of claim 1, wherein the entry port is generally circumscribed by an inner edge, the inner edge including a plurality of straight edge portions separated by a plurality of arcuate edge portions.

7. The fan of claim 1, wherein the entry port is generally circumscribed by a curved inner edge.

8. The fan of claim 1, wherein the abrupt step includes a curved surface.

9. The fan of claim 1, wherein the entry port includes a surface oriented generally parallel to the flow path, and wherein the transition zone includes a surface oriented generally perpendicular to the flow path, an upstream portion of the abrupt step being defined by the intersection of the entry port surface and the transition zone surface.

10. The fan of claim 9, wherein the entry port surface and the transition zone intersect.

11. The fan of claim 1, wherein the transition zone includes a first surface oriented generally parallel to the flow path, a second surface generally parallel to the flow path, and a transition surface between the first surface and the second surface.

12. The fan of claim 11, wherein the transition surface includes a curved portion.

13. The fan of claim 1, wherein the abrupt step is defined in part by a pair of intersecting and generally mutually perpendicular surfaces.

14. The fan of claim 13, wherein the abrupt step is further defined in part by a curved surface formed in the transition zone and disposed downstream of the pair of intersecting surfaces.

15. The fan of claim 1, wherein the entry port is defined in a plate, the plate being removably attached to the housing.

16. The fan of claim 1, wherein the entry port includes an inner surface oriented generally parallel to the flow path, and further wherein the inner surface is shaped so that a number of protrusions extend into the flow path.

17. The fan of claim 16, wherein the protrusions are separated by semicircular cutouts.

18. The fan of claim 16, wherein the protrusions include a plurality of fins.

19. The fan of claim 18, wherein the fins are angled relative to a rotational direction of the rotor.

20. For use with an electronic component, a muffin-type cooling fan comprising:

a rotor having a plurality of fan blades and being rotatably mounted within a housing, the housing having a flared inlet, an outlet, and an interconnecting passage defining an air flow path therethrough; and an entry port disposed upstream of the inlet, the entry port having a cross sectional area greater than a maximum cross section area defined by the flared inlet such that a step is defined adjacent an interface between the entry port and the flared inlet, and wherein the cross-sectional area of the entry port is between about 5% to about 10% greater than a cross-sectional area of the passage;

whereby the entry port and the step cooperate to lower the ambient noise level produced by the cooling fan.

21. The cooling fan of claim 20, wherein the passage has a nominal diameter of about 3 inches and a length of about 1.5 inches, and further wherein the entry port has a length between about 4% and about 13% of the passage length.

22. The cooling fan of claim 20, wherein a length of the entry port is between about 4% and about 13% of a length of the passage.

23. The cooling fan of claim 20, wherein the entry port is generally circumscribed by an inner edge, the inner edge including a plurality of straight edge portions separated by a plurality of arcuate edge portions.

24. The cooling fan of claim 20, wherein the entry port is generally circumscribed by an inner edge having a curved portion.

25. The cooling fan of claim 20, wherein at least a portion of the flared inlet includes a curved surface, the curved surface being disposed generally adjacent and downstream of the step.

26. The cooling fan of claim 20, wherein the entry port includes an inner surface oriented generally parallel to the flow path, and further including a surface adjacent the flared inlet oriented generally perpendicular to the flow path, an upstream portion of the step being defined by the intersection of the entry port surface and the surface adjacent the flared inlet.

27. The cooling fan of claim 26, wherein the entry port surface and the surface adjacent the flared inlet intersect.

28. The cooling fan of claim 20, wherein the step is defined in part by a first surface disposed adjacent the entry port and being oriented generally parallel to the flow path, a second surface disposed within the passage and being generally parallel to the flow path, and at least one transition surface between the first surface and the second surface.

29. The cooling fan of claim 28, wherein the transition surface includes a curved portion.

30. The cooling fan of claim 20, wherein the step is defined in part by a pair of intersecting and generally mutually perpendicular surfaces disposed downstream of the pair of intersecting surfaces.

31. The cooling fan of claim 20, wherein the entry port is defined in a plate, the plate being removably attached to the housing adjacent the flared inlet.

32. A method of reducing the ambient noise level of a muffin-type cooling fan, the method comprising the steps of:

providing a muffin-type cooling fan having a housing, a passage extending through the housing, and an inlet in flow communication with the passage;

providing a shroud plate having an entry port, the entry port being sized to have a cross sectional area larger than a cross sectional area of the passage; and securing the shroud plate to the housing adjacent the inlet at an interface such that a step is formed at the interface.

33. The method of claim 32, including the additional step of sizing the entry port to have a length between about 4% and about 13% of a length of the passage.

34. The method of claim 32, including the additional step of shaping an inner surface of the housing adjacent the inlet to define a portion of the step.

35. The method of claim 34, wherein the inner surface includes a curved portion.

* * * * *